(12) United States Patent
Singh et al.

(10) Patent No.: US 7,020,857 B2
(45) Date of Patent: Mar. 28, 2006

(54) METHOD AND APPARATUS FOR PROVIDING NOISE SUPPRESSION IN A INTEGRATED CIRCUIT

(75) Inventors: Raminderpal Singh, Essex Junction, VT (US); Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 10/063,859

(22) Filed: May 20, 2002

(65) Prior Publication Data

US 2003/0214348 A1 Nov. 20, 2003

(51) Int. Cl.
*G06F 17/50* (2006.01)

(52) U.S. Cl. .................. 716/5; 716/2; 716/8; 257/173; 257/359; 257/371

(58) Field of Classification Search .................. 716/2, 716/5, 8, 19; 257/173, 359, 371
See application file for complete search history.

(56) References Cited

U.S. PATENT DOCUMENTS

| | | | | |
|---|---|---|---|---|
| 4,476,476 A | * | 10/1984 | Yu et al. ..................... | 257/359 |
| 5,945,713 A | * | 8/1999 | Voldman ..................... | 257/355 |
| 6,057,184 A | * | 5/2000 | Brown et al. ................ | 438/199 |
| 6,097,068 A | * | 8/2000 | Brown et al. ................ | 257/371 |
| 6,232,639 B1 | * | 5/2001 | Baker et al. ................. | 257/372 |
| 2001/0025963 A1 | * | 10/2001 | Tashiro et al. .............. | 257/173 |

OTHER PUBLICATIONS

T. Li et al., Substrate Modeling and Lumped Substrate Resistance Extraction for CMOS ESD/Latchup Circuit Simulation, Proceedings of the 36$^{th}$ ACM/IEEE Conferencce on Design Automation, pages 549-554, Jun. 1999.*
W. Winkler et al., Active Substrate Noise Suppression in Mixed-Signal Circuits Using On-Chip Driven Guard Rings, Proceedings of the IEEE 2000 Custom Integrated Circuits Conference, pp. 356-360, May 2000.*
B. Owens et al., Strategies for Simulation, Measurement and Suppression of Digital Noise in Mixed-Signal Circuits, Proceedings of the IEEE 2003 Custom Integrated Circuits Conference, pp. 361-364, Sep. 2003.*
A. Koukab et al., Analysis and Optimization of Substrate Noise Coupling in Single-Chip RF Transceiver Design, Proceedings of the 2002 IEEE/ACM International Conference on Computer-Aided Design, pp. 309-316, Nov. 2002.*
H. Chan et al., A Practical Substrate Modeling Algorithm with Active Guardband Macromodel for Mixed-Signal Substrate Coupling Verification, 8$^{th}$ IEEE International Conference on Electronics, Circuits, and Systems, pp. 1455-1460, Sep. 2001.*

(Continued)

*Primary Examiner*—A. M. Thompson
(74) *Attorney, Agent, or Firm*—Michael J. Lestrange

(57) ABSTRACT

A method and apparatus for analyzing an integrated circuit design for pnpn structures which are likely to latchup or cause injection of noise into the substrate. Once qualifying pnpn structures are identified, the method and apparatus automatically inserts a noise and latchup suppression circuit of the designers' choice into the pnpn structure to eliminate the latchup and/or noise concerns.

21 Claims, 7 Drawing Sheets

OTHER PUBLICATIONS

M. Nagata et al., Quantitative Characterization of the Substrate Noise for Physical Design Guides in Digital Circuits, Proceedings of the IEEE Custom Integrated Circuits Conference, pp. 95-98, May 2000.*

J. Hwang, REX—A VLSI Parasitic Extraction Tool for Electromigration and Signal Analysis, 28$^{th}$ ACM/IEEE Design Automation Conference, pp. 717-722, Jun. 1991.*

T. Li et al., Substrate Modeling and Lumped Substrate Resistance Extraction for CMOS ESD/Latchup Simulation, Proceedings of the 36$^{th}$ ACM/IEEE Conference on Design Automation, pp. 549-554, Jun. 1999.*

H. Chan et al., A Practical Substrate Modeling Algorithm with Active Guardband Macromodel for Mixed-Signal Substrate Coupling Verification, Eighth IEEE International Conference on Electronics, Circuits, and Systems, pp. 1455-1460, Sep. 2001.*

T. Li et al., Layout Extraction and Verification Methodology for CMOS I/O Circuits, Proceeding of the Design Automation COnference, pp. 291-296, Jun. 1998.*

* cited by examiner

METHOD AND APPARATUS FOR PROVIDING NOISE SUPPRESSION IN A INTEGRATED CIRCUIT

BACKGROUND OF THE INVENTION

1. Field of the Invention

The present invention generally relates to integrated circuits, and more particularly to providing latchup and noise suppression in such integrated circuits.

2. Description of the Related Art

As electronic components are getting smaller and smaller along with the internal structures in integrated circuits, it is getting easier to either completely destroy or otherwise impair electronic components from latchup. Latchup is when a pnpn structure transitions from a low current high voltage state to a high current low voltage state through a negative resistance region (i.e. forming an S-Type I-V (current/voltage) characteristic).

Latchup is typically understood as occurring within a pnpn structure, or silicon controlled rectifier (SCR) structure. Interestingly enough, these pnpn structures can be intentionally designed, or even unintentionally formed between structures. Hence, latchup conditions can occur within peripheral circuits or internal circuits, within one circuit (intra-circuit) or between multiple circuits (intercircuit).

Latchup is typically initiated by an equivalent circuit of a cross-coupled pnp and npn transistor. With the base and collector regions being cross-coupled, current flows from one device leading to the initiation of the second ("regenerative feedback"). These pnp and npn elements can be any diffusions or implanted regions of other circuit elements (e.g. P-channel MOSFETs, N-Channel MOSFETs, resistors, etc) or actual pnp and npn bipolar transistors. In CMOS, the pnpn structure can be formed with a p-diffusion in a n-well, and a n-diffusion in a p-substrate ("parasitic pnpn"). In this case, the well and substrate regions are inherently involved in the latchup current exchange between regions.

The condition for triggering a latchup is a function of the current gain of the pnp and npn transistors, and the resistance between the emitter and the base regions. This inherently involves the well and substrate regions. The likelihood or sensitivity of a particular pnpn structure to latchup is a function of spacings (e.g. Base width of the npn and base width of the pnp), current gain of the transistors, substrate resistance and spacings, the well resistance and spacings, and isolation regions.

System-on-a-chip (SOC) solutions have been used for solving the mixed signal (voltage) and radio frequency (RF) requirements of high-speed data rate transmission, optical interconnect, wireless and wired marketplaces. Each of the noted applications has a wide range of power supply conditions, number of independent power domains, and circuit performance objectives. Different power domains are established between digital, analog and radio frequency (RF) functional blocks on an integrated chip. Part of the SOC solution has resulted in different circuit and system functions being integrated into a common chip substrate. The integration of different circuits and system functions into a common chip has also resulted in solutions for ensuring that noise from one portion or circuit of the chip does not affect a different circuit within the chip.

In internal circuits and peripheral circuitry, latchup and noise are both a concern. Latchup and noise are initiated in the substrate from overshoot and undershoot phenomenon. These can be generated by CMOS off-chip driver circuitry, receiver networks, and ESD devices. In CMOS I/O circuitry, undershoot and overshoot can lead to injection in the substrate. Hence, both a p-channel MOSFET and n-channel MOSFET can lead to substrate injection. Simultaneous switching of circuitry where overshoot or undershoot injection occurs, leads to injection into the substrate which leads to both noise injection and latchup conditions. Supporting elements in these circuits, such as pass transistors, resistor elements, test functions, over voltage dielectric limiting circuitry, bleed resistors, keeper networks and other elements can be present leading to injection into the substrate. ESD elements connected to the input pad can also lead to noise injection and latchup. ESD elements that can lead to noise injection, and latchup include MOSFETs, pnpn SCR ESD structures, p+/n-well diodes, n-well-to-substrate diodes, n+ diffusion diodes, and other ESD circuits. ESD circuits can contribute to noise injection into the substrate and latchup.

Unfortunately, the designers of the circuits often fail to anticipate or recognize the appearance of parasitic pnpn structures. Even when the circuit designer does recognize or anticipate parasitic pnpn structures, the solutions for reducing the latchup tolerance often result in unnecessarily increasing the introduction of noise into the power rails.

It would, therefore, be a distinct advantage to have a method and apparatus that improved both noise suppression and latchup tolerance in an integrated circuit. It would be further advantages if the method and apparatus would be integrated into a software tool such that the tool searched for these parastic pnpn structures and automatically inserted a solution for reducing latchup and noise suppression. The present invention provides such a method and apparatus.

BRIEF SUMMARY OF THE INVENTION

The present invention is a method and apparatus for analyzing an integrated circuit design and recognizing parasitic pnpn structures. Upon such recognition, the present invention would automatically insert a noise and latchup suppression circuit of the designers choice. In addition, further changes to the substrate can be specified to increase the effective resistance.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Detailed Description of a Preferred Embodiment of the Invention

Figure 1:
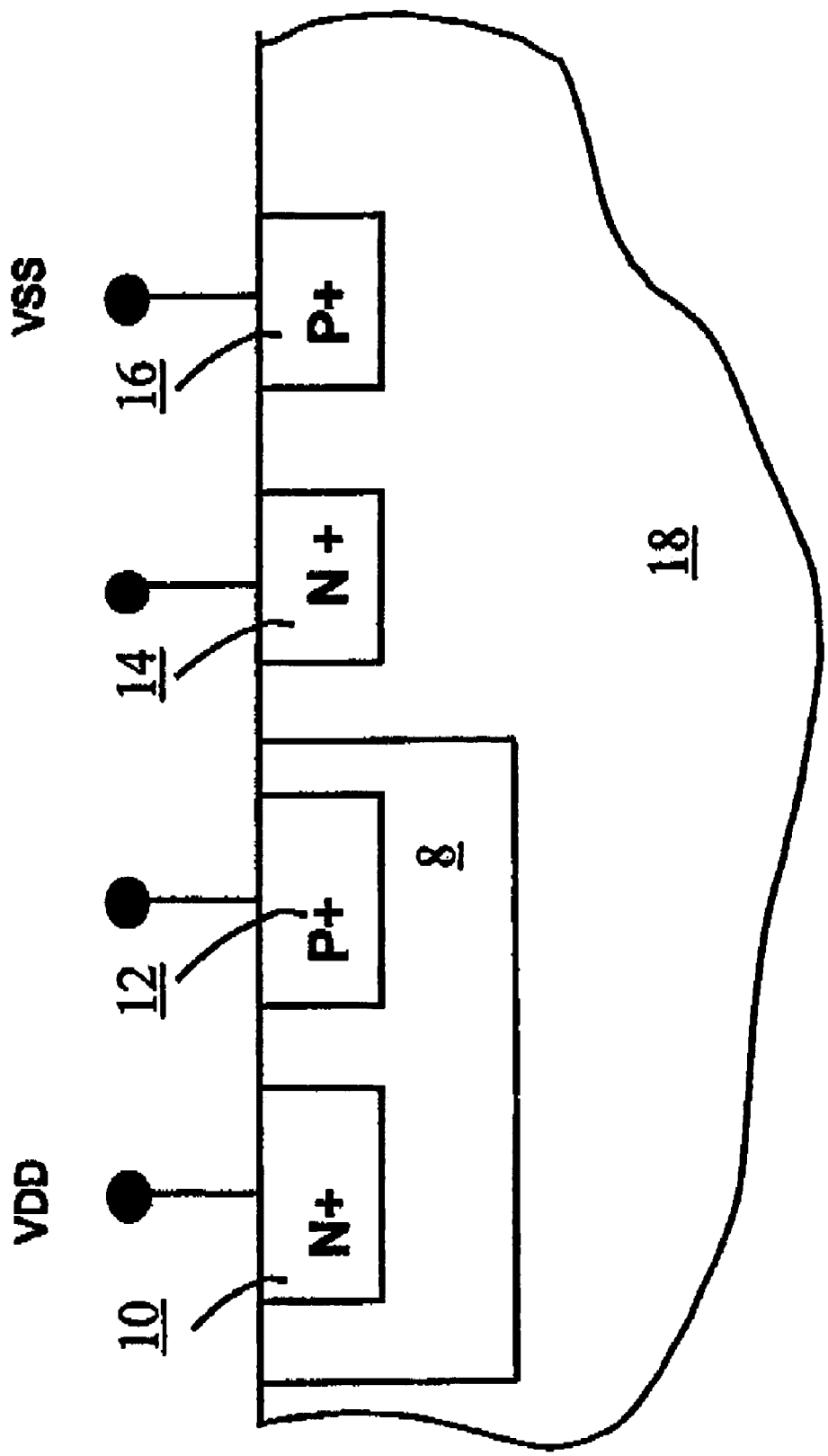
FIG. 1 is a cross section diagram illustrating a parasitic latchup structure environment in an integrated circuit.

Reference now being made to FIG. 1, a cross section diagram is shown illustrating a parasitic latchup structure environment in an integrated circuit. The integrated circuit includes a substrate 18 having an n-well region 8 with a well contact 10.

N-well region 8 can represent a diffused well, a retrograde well, a subcollector, or other vertical modulated wells. Substrate 18 can represent a p-well, a p– epi/p+ substrate, a p– wafer with a p+ buried layer, or other known substrate doping profiles.

Located within n-well region is p-doped shape 12 that can be used to form a p-channel MOSFETs, p-resistors, p/n diode, an ESD element or a base region of a npn bipolar. Also located within substrate 18 is n-doped region 14 that can be used to form an n-channel MOSFETs, a n-resistor, a diode, an ESD element or a collector of a npn transistor, or any other structure requiring a n-doped region. Substrate 18 also includes a substrate contact 16. It should also be noted that power (VDD) and ground (VSS) are applied to well contact 10 and substrate contact 16, respectively. The structure illustrated in FIG. 1 demonstrates the ease with which a parasitic pnpn structure can be formed in either a CMOS or BiCMOS technology from the p-doped shape 12, the n-well 8, substrate 18 and n-region 14. The parasitic pnpn structure can cause undesirable latchup and/or noise problems.

In the above configuration where there are connections (10 and 16) directly to the power grid, noise is able to leave the area of the circuit in which it is generated and is injected into the power domain (e.g. VSS or VDD) of the chip. Unfortunately, the noise level can become significant enough to impact the noise floor of adjacent circuits on the same power grid. Furthermore, allowing the injection into the substrate region or well region can initiate a latchup state. For example, if region 14 is grounded and a positive pulse is applied to p-region 12, latchup can occur. In further example, negative pulses can initiate a latchup between region 12 and 14. In addition, a negative undershoot on region 14 can lead to noise injection into the substrate that can be absorbed by n-well contact region 10 and by substrate contact region 16.

Figure 2:
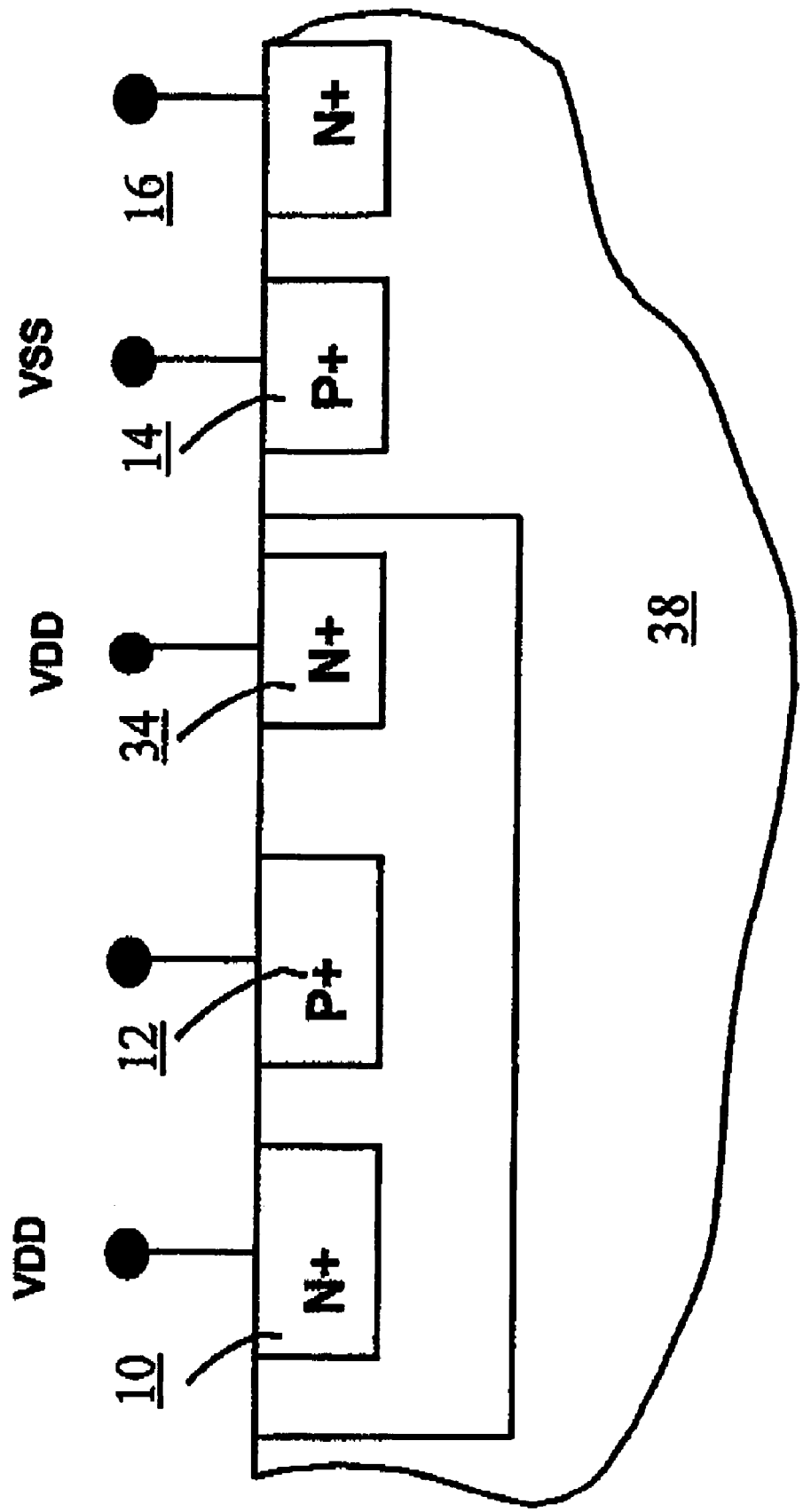
FIG. 2 is a cross section diagram illustrating an example of a parasitic latchup structure in an integrated circuit.

Reference now being made to FIG. 2, a cross section diagram is shown illustrating an example of a parasitic latchup structure in an integrated circuit. This example is similar to that shown in FIG. 1 with the addition of a new guard ring structure 34 to the N-well. Guard ring structure 34 is intended to improve latchup tolerance or sensitivity. Guard ring structure 34 will typically be connected to a power rail (e.g. VDD) with a salicided contact area and contacts to provide a low resistance path to VDD. In this example, the guard ring 34 improves the latchup tolerance, however, the overshoot noise which can initiate the latchup is injected into the ground rail (VSS), and possible spread to other circuits.

As illustrated in the prior FIGS. 1–2, solutions for improving latchup tolerance have been used, however, these circuits introduce noise into the power rails (e.g. VDD or VSS) which is also undesirable. The present invention provides a solution for improving latchup tolerance and at the same time limiting the amount of noise introduced into the power rails.

Figure 3:
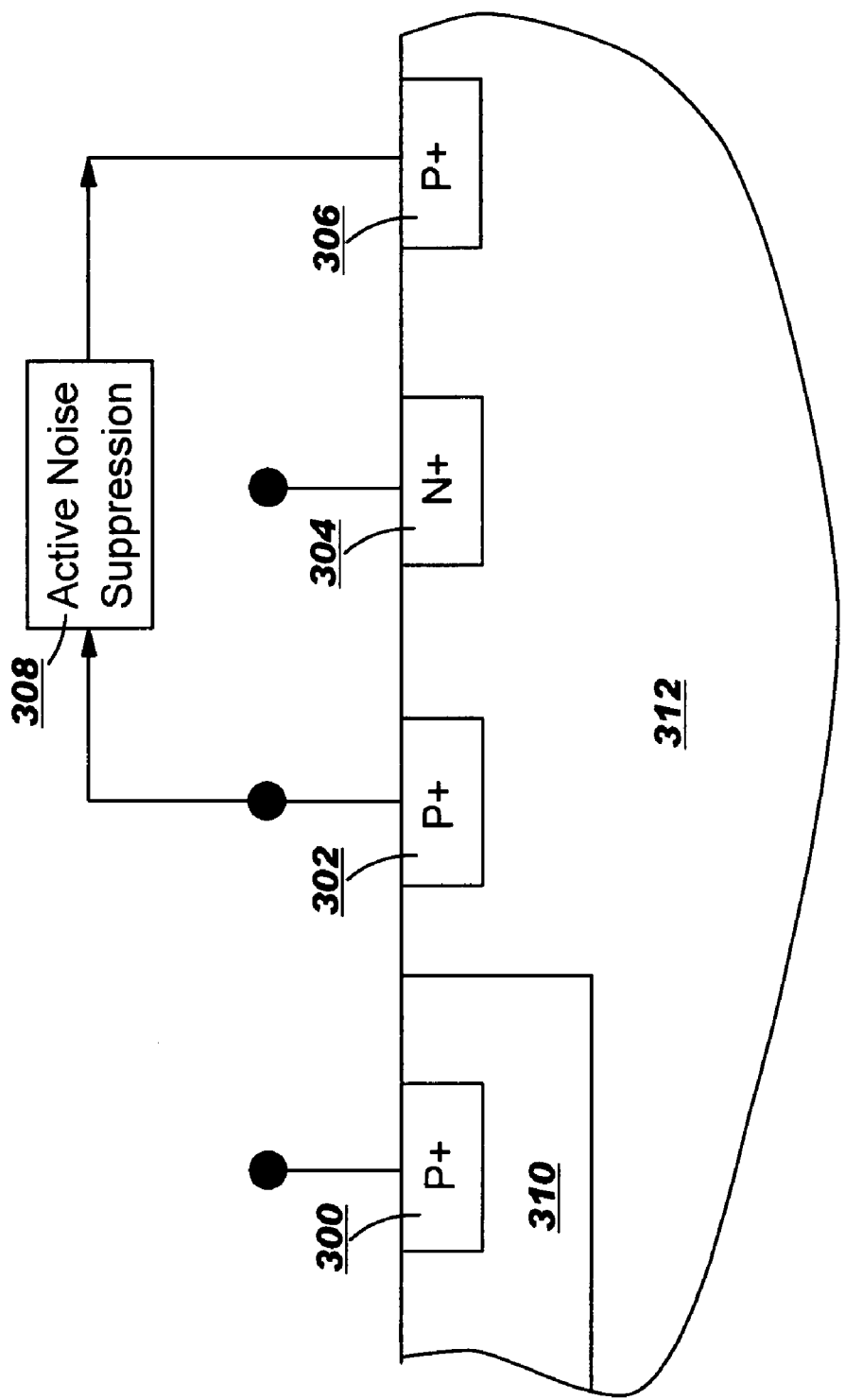
FIG. 3 is a cross section diagram illustrating an example of the how the present invention can be implemented within an integrated circuit.

Reference now being made to FIG. 3, a cross section diagram is shown illustrating an example of the how the present invention can be implemented within an integrated circuit. The integrated circuit includes a p+ region 300 contained with a well region 310 a substrate 312, an n-region 304 in the substrate, and a substrate contact 306 (noise suppression collecting structure). In this particular embodiment, a p-region 302 (noise suppression collecting structure) is placed within the parasitic pnpn structure (306,304,300). In addition, an active noise suppression circuit 308 is also added with an input connected to p-region 302, and an output connected to substrate contact 306.

P-region 302 can be a guard ring which is not connected to the ground potential, or any additional shape that improves latchup tolerance. A guard ring is a structure which collects minority carriers or obstructs the flow of minority carriers in the substrate. Any current or voltage signal intiated on p-region 302 is directed to the active noise suppression circuit 308. Noise suppression circuit 308 inverts the directed signal and applies the inverted signal to the region of the substrate where voltage increase or decrease has occurred locally in the substrate 64. By using the Noise suppression circuit 308, the signal produced from electrical overshoot or noise injection does not directly feed directly into the ground or power rails.

Figure 4:
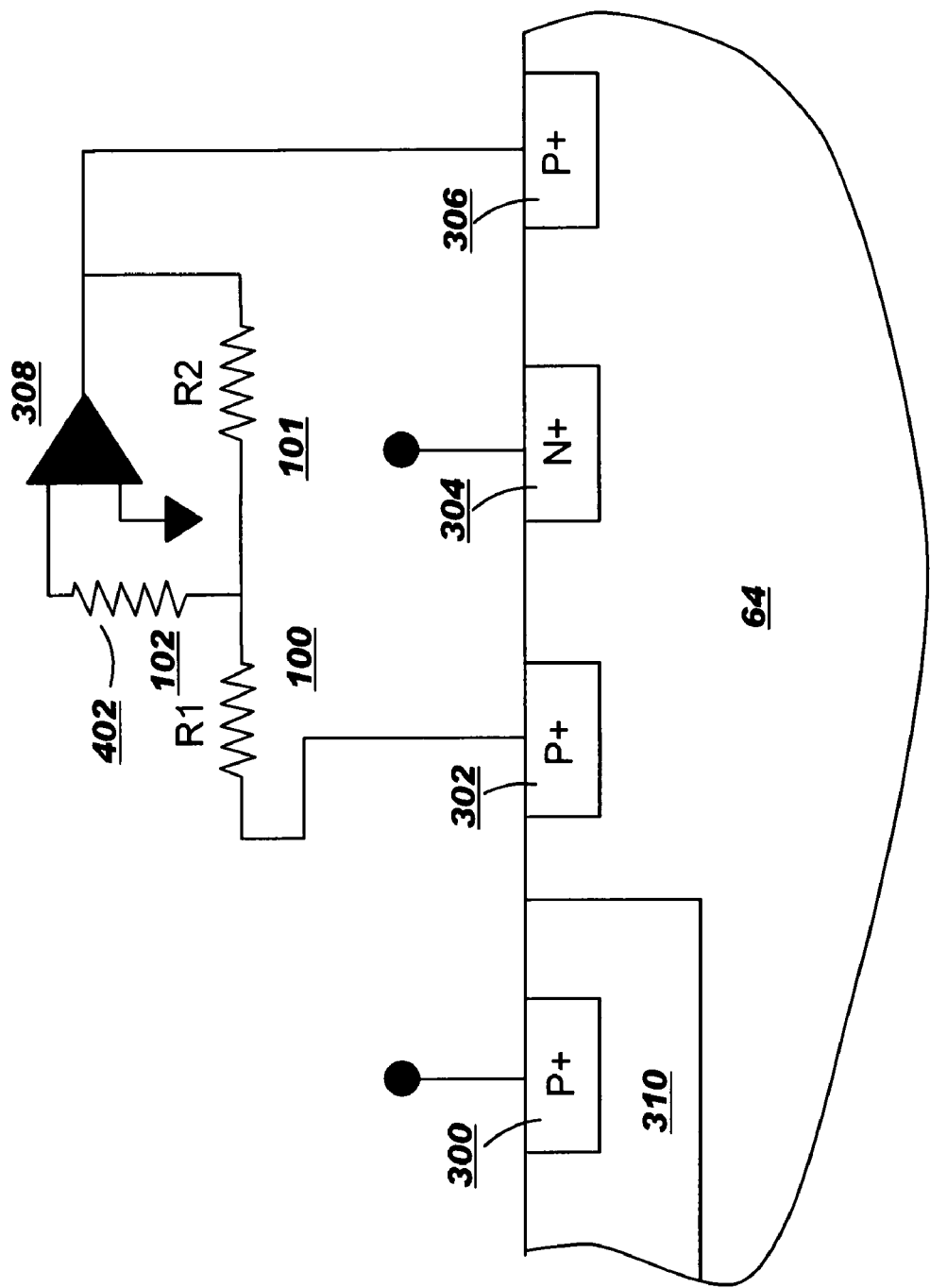
FIG. 4 is a cross section diagram illustrating an example of how the noise suppression circuit of FIG. 3 can be implemented according to the teachings of the present invention.

Reference now being made to FIG. 4, a cross section diagram is shown illustrating an example of how the noise suppression circuit 308 of FIG. 3 can be implemented according to the teachings of the present invention. In this example, the noise suppression circuit 308 is illustrated as an inverting amplifier 94 coupled to resistors 100, 101 and 102 as shown.

Figure 5:
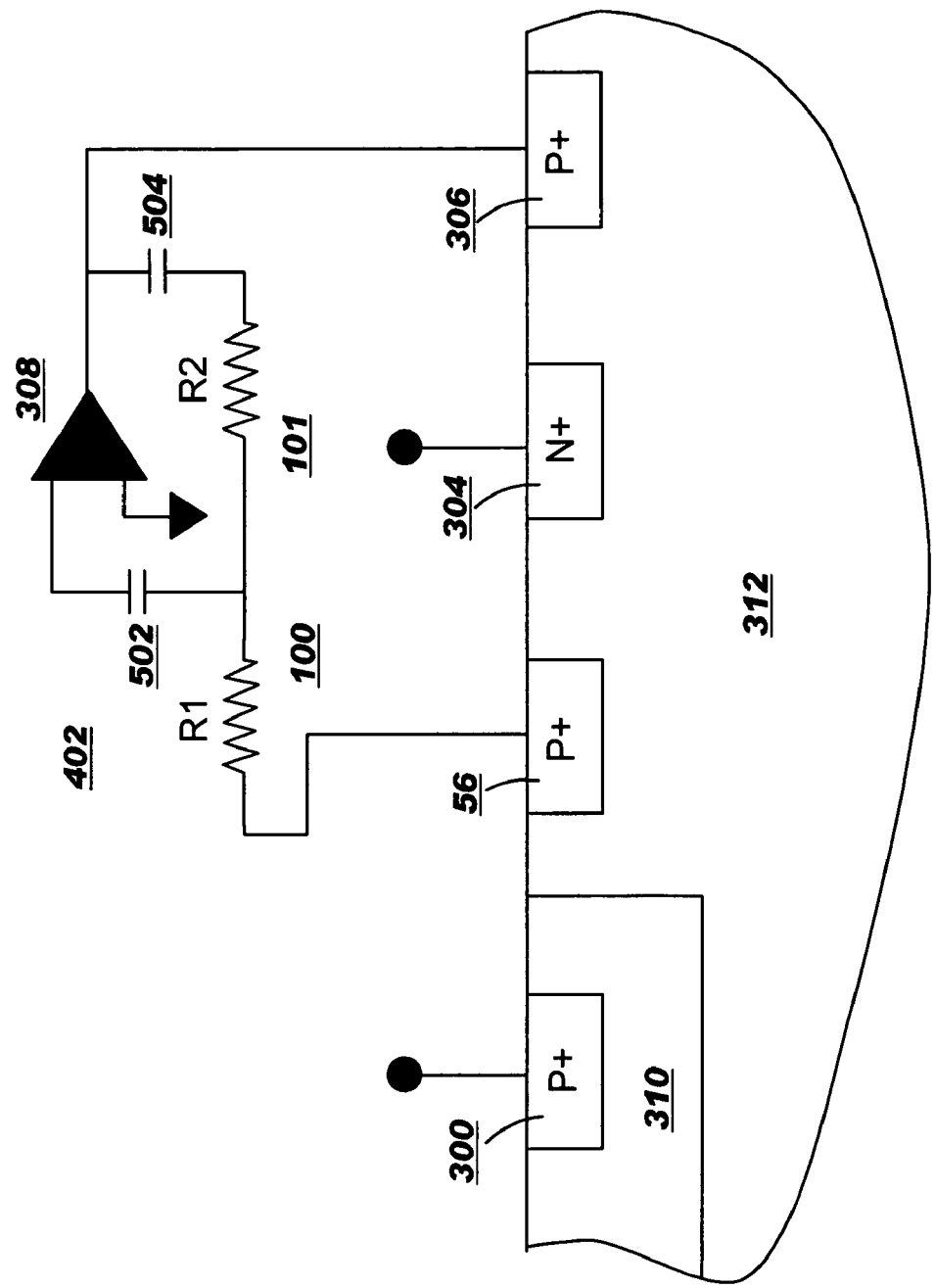
FIG. 5 is a cross section diagram illustrating an additional example of how the noise suppression circuit of FIG. 3 can be implemented according to the teachings of the present invention.

Reference now being made to FIG. 5, a cross section diagram is shown illustrating an additional example of how the noise suppression circuit 308 of FIG. 3 can be implemented according to the teachings of the present invention. The noise suppression circuit 308 is identical to that shown in FIG. 4 with the addition of capacitive elements 502 and 504.

Figure 6:
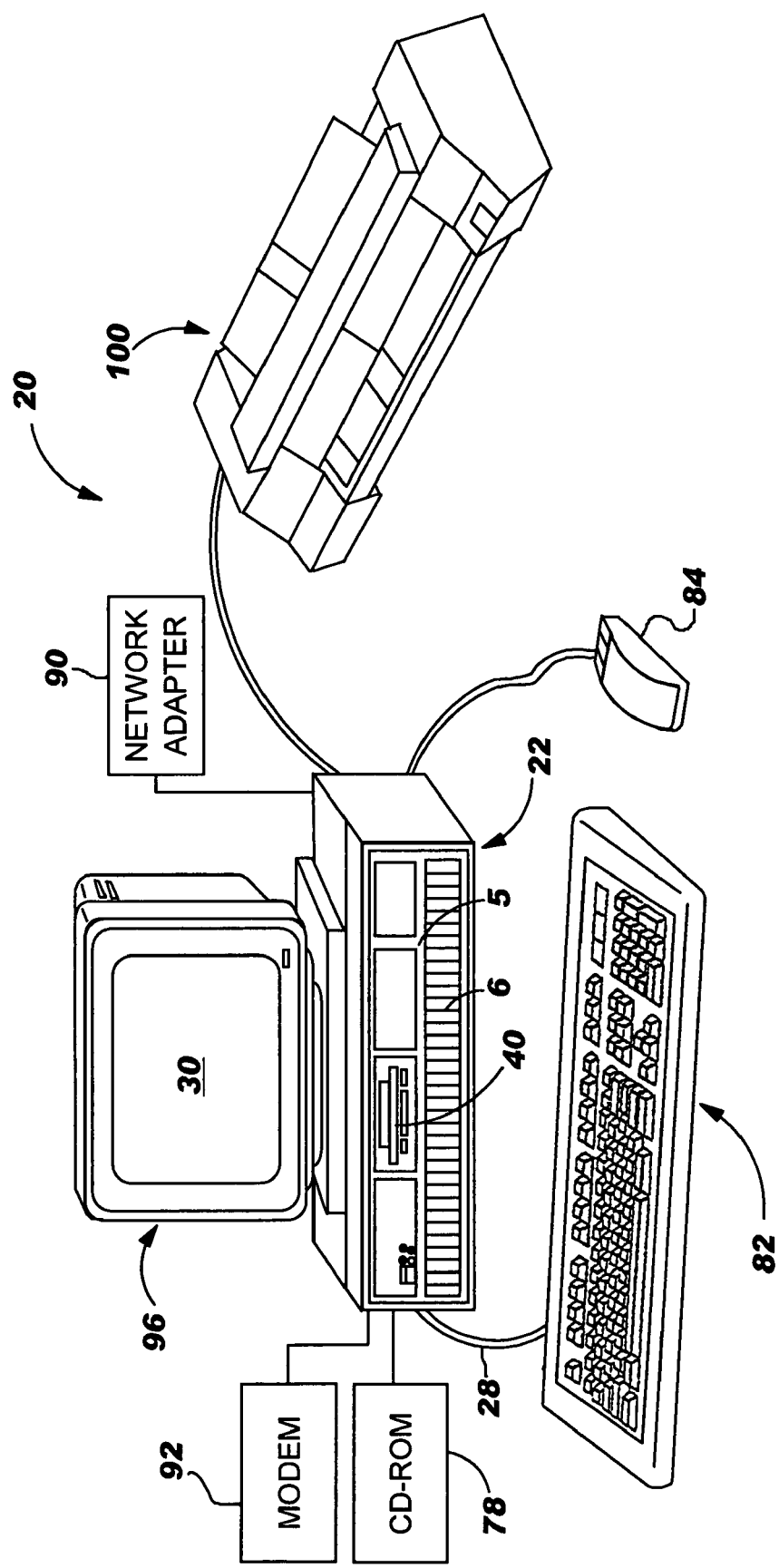
FIG. 6 is a diagram illustrating a data processing system in which the present invention can be practiced.

Reference now being made to FIG. 6, a diagram is shown illustrating a data processing system 20 in which the present invention can be practiced. The data processing system 20 includes processor 22, keyboard 82, and display 96. Keyboard 82 is coupled to processor 22 by a cable 28. Display 96 includes display screen 30, which may be implemented using a cathode ray tube (CRT) a liquid crystal display (LCD) an electrode luminescent panel or the like. The data processing system 20 also includes pointing device 84, which may be implemented using a track ball, a joy stick, touch sensitive tablet or screen, track path, or as illustrated a mouse. The pointing device 84 may be used to move a pointer or cursor on display screen 30. Processor 22 may also be coupled to one or more peripheral devices such as modem 92, CD-ROM 78, network adapter 90, and floppy disk drive 40, each of which may be internal or external to the enclosure or processor 22. An output device such as printer 100 may also be coupled with processor 22.

The present invention can be embodied within various types of software including but not limited to Computer Aided Design (CAD) software executing on the processing system 20 of FIG. 1. In general, the software identifies parasitic pnpn structures and inserts a latchup noise suppression circuit that raises the resistance of the substrate. In the preferred embodiment of the present invention, the latchup suppression circuit(s) illustrated and described above in connection with FIGS. 3–5 are used. The execution of the software is explained in connection with the flow chart of FIG. 7.

Figure 7:
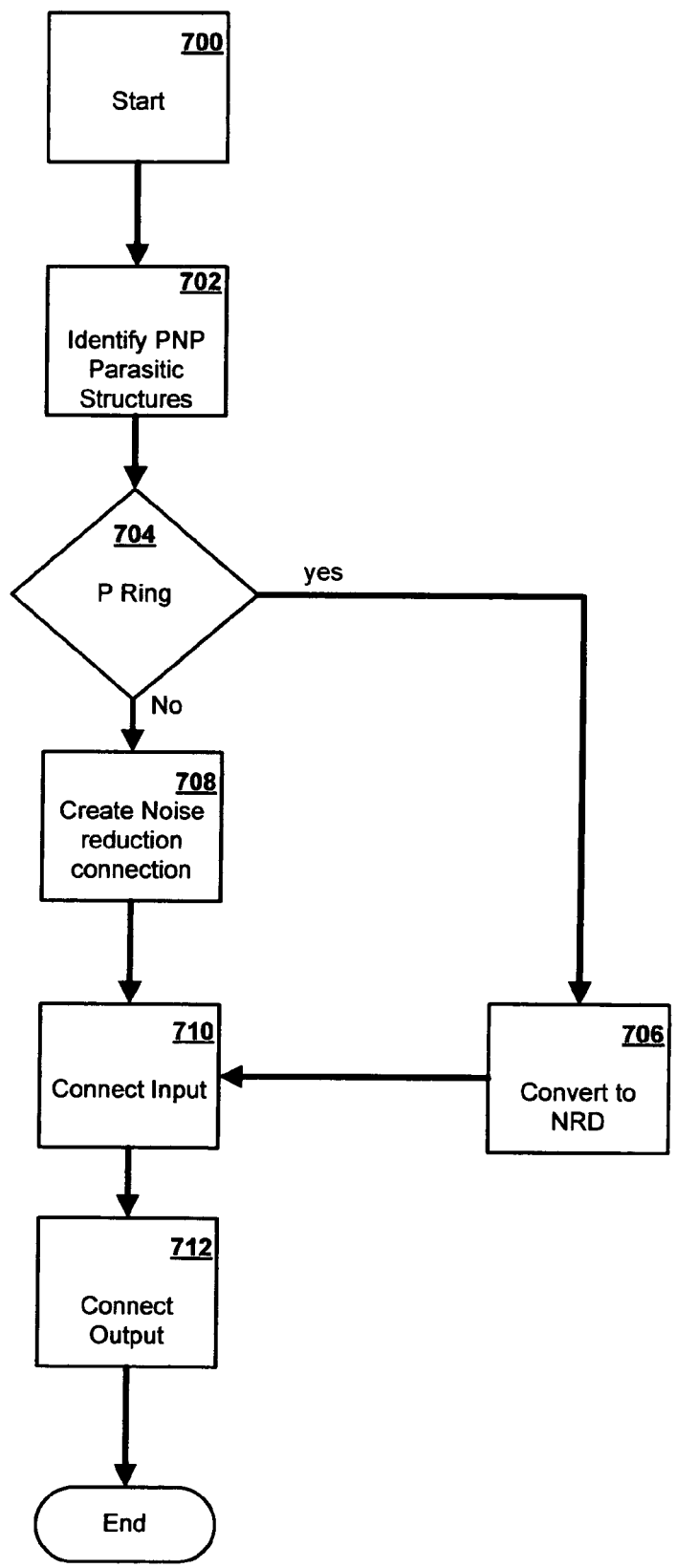
FIG. 7 is a flow chart is shown illustrating the execution, on the data processing system of FIG. 6, of a preferred embodiment of software for automatically recognizing parasitic pnpn structures and inserting a latchup noise suppression circuit according to the teachings of the present invention.

Reference now being made to FIG. 7, a flow chart is shown illustrating the execution, on the data processing system 20 of FIG. 6, of a preferred embodiment of software for automatically recognizing parasitic pnpn structures and inserting a latchup noise suppression circuit according to the teachings of the present invention. The execution of the software is illustrated in FIG. 7 with an example illustrated therewith using FIGS. 1 and 3.

The execution of the software begins executing (step 700) by identifying the following (step 130): (1) any p shapes that are connected to a power supply (VDD or VSS); (2) whether there is an associated parasitic pnp structure for the identified p shape(s); (3) a ground substrate contact connected to VSS; (4) the parasitic npn structure; and (5) an identification of the parasitic pnpn structure.

The identification is accomplished by evaluating the localness of the emitter and collector regions for each parasitic structure, and then determining if any two of the parasitic structures are cross-coupled (e.g. sharing common regions) and spatially local to one another. The identification of shapes connected to the power supplies can use a logical-to-physical check, and spacings can be verified by spatial ground rule check systems.

For example, using the structure illustrated in FIG. 1, the following would be identified: (1) p+ 16; (2) p+ 16, substrate 18, and n+ 14; (3) p+ 16; (4) n+ 10, p+ 12, and n-well 8; and (5) pnpn structure (p doped substrate 18, n+ 14 and p doped substrate 18), pnpn structure (p doped substrate 18, n-well 8, p+ 12).

Once a parasitic pnpn shape(s) has been identified, the software datermines whether a p+ ring has been inserted in the pnpn parasitic structure (step 704) (In the case of FIG. 1, no p+ ring exists). If the p+ ring exists, then it is converted to a noise reduction connection (step 706). It however, the p+ ring does not exists, ten a noise reduction connection is inserted in the pnpn parasitic structure (step 708). Referencing FIG. 3, the noise reduction connection for the example is p+ 302.

The software provides the designer with a plurality of noise suppression circuits to select depending upon the particular design and/or requirements. The selection can be made upon each discovery of the pnpn structure or prior to the identification and used throughout automatically. Alternatively, the designer could also select a default noise suppression circuit that can be used automatically, unless certain criteria exists. Obvious variations on the selections and criteria could also be provided but are not discussed in detail hereinafter.

In this particular case, it can be assumed that the designer has selected the default automatic option, and the input of the selected noise suppresion circuit is connected to the noise reduction connection (Step 710) (p+ 302 of FIG. 3). The output of the noise suppression circuit can be connected in various manners all of which reduce the resistance of the substrate (Step 712). For example, the existing structure coupled to VSS could be used or converted to only be coupled to the noise suppression circuit. In addition, a noise reduction connection can also be added before the existing structure coupled to VSS. Provided the noise suppression circuit is coupled to receive the latchup current and inject the inversion of the lathup current locally (within 100 microns of where the latchup current was received), any manner that meets this criteria can be used. In addition, it would be further advantageous if the use of the noise suppression circuit would increase the effective resistance of the substrate. This can be accomplished by replacing some of the substrate contacts when the noise suppresion circuit is inserted as previously described.

For the current example, the p+ 16 VSS contact is converted to serve as an output to the active latchup noise suppression circuit.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. A method of improving latchup tolerance in an integrated circuit having a substrate with an effective resistance, the method comprising the steps of:
   identifying any parasitic pnpn structures; and
   automatically inserting a suppression circuit that suppresses noise and improves latchup tolerance into the parasitic pnpn structure, the suppression circuit also increasing the effective resistance of the substrate.

2. The method of claim 1 wherein the step of automatically inserting a suppression circuit includes the step of:
   coupling the suppression circuit to a p+ ring within the pnpn structure.

3. The method of claim 2 wherein the suppression circuit has an output, and the step of automatically inserting a suppression circuit includes the step of:
   coupling the output of the suppression circuit to an additional circuit such that any current provided to the suppression circuit is inverted and injected back into the substrate.

4. A method of improving latchup tolerance in an integrated circuit having a substrate with an effective resistance, the method comprising the steps of:
   identifying any parasitic pnpn structures; and
   automatically inserting a suppression circuit that suppresses noise and improves latchup tolerance into the parasitic pnpn structure, the suppression circuit including a ring structure located within the pnpn structure.

5. The method of claim 4 wherein the suppression circuit includes an output, and the step of automatically inserting a suppression circuit includes the step of:
   coupling the output of the suppression circuit to an additional circuit such that any current provided to the suppression circuit is inverted and injected back into the local substrate.

6. The method of claim 5 wherein the step of automatically inserting a suppression circuit includes the step of:
   changing the effective resistance of the substrate.

7. The method of claim 6 wherein the step of changing the effective resistance of the substrate includes the step of:
   increasing the effective resistance of the substrate.

8. An apparatus for improving latchup tolerance in an integrated circuit having a substrate with an effective resistance, the apparatus comprising:
   means for identifying any parasitic pnpn structures; and
   means for automatically inserting a suppression circuit that suppresses noise and improves latchup tolerance into the parasitic pnpn structure, the suppression circuit also increasing the effective resistance of the substrate.

9. The apparatus of claim 8 wherein the means for automatically inserting a suppression circuit includes:
means for coupling the suppression circuit to a p+ ring within the pnpn structure.

10. The apparatus of claim 9 wherein the suppression circuit includes an output, and the means for automatically inserting a suppression circuit includes:
means for coupling the output of the suppression circuit to an additional circuit such that any current provided to the suppression circuit is inverted and injected back into the local substrate.

11. An apparatus for improving latchup tolerance in an integrated circuit having a substrate with an effective resistance, the apparatus comprising:
means for identifying any parasitic pnpn structures; and
means for automatically inserting a suppression circuit that suppresses noise and improves latchup tolerance into the parasitic pnpn structure, the suppression circuit including a p+ ring structure located within the pnpn structure.

12. The apparatus of claim 11 wherein the suppression circuit includes an output, and the means for automatically inserting a suppression circuit includes:
means for coupling the output of the suppression circuit to an additional circuit such that any current provided to the suppression circuit is inverted and injected back into the local substrate.

13. The apparatus of claim 12 wherein the means for automatically inserting a suppression circuit includes:
means for changing the effective resistance of the substrate.

14. The apparatus of claim 13 wherein the means for changing the effective resistance of the substrate includes:
means for increasing the effective resistance of the substrate.

15. A computer program product comprising:
a computer usable medium having computer readable program code means embodied in the medium for improving latchup tolerance in an integrated circuit having a substrate with an effective resistance, the computer readable program code means including:
means for identifying any parasitic pnpn structures; and
means for automatically inserting a suppression circuit that suppresses noise and improves latchup tolerance into the parasitic pnpn structure, the suppression circuit also increasing the effective resistance of the substrate.

16. The computer program product of claim 15 wherein the means for automatically inserting a suppression circuit includes:
means for coupling the suppression circuit to a p+ ring within the pnpn structure.

17. The computer program product of claim 16 wherein the suppression circuit includes an output, and the means for automatically inserting a suppression circuit includes:
means for coupling the output of the suppression circuit to another structure such that any current provided to the circuit is inverted and injected back into the local substrate.

18. A computer program product comprising:
a computer usable medium having computer readable program code means embodied in the medium for improving latchup tolerance in an integrated circuit having a substrate with an effective resistance, the computer readable program code means including:
means for identifying any parasitic pnpn structures; and
means for automatically inserting a suppression circuit that suppresses noise and improves latchup tolerance into the parasitic pnpn structure, the suppression circuit including a p+ ring structure located within the pnpn structure.

19. The computer program product of claim 18 wherein the suppression circuit includes an output, and the means for automatically inserting a suppression circuit includes:
means for coupling the output of the suppression circuit to an additional circuit such that any current provided to the suppression circuit is inverted and injected back into the local substrate.

20. The computer program product of claim 19 wherein the means for automatically inserting a suppression circuit includes:
means for changing the effective resistance of the substrate.

21. The computer program product of claim 20 wherein the means for changing the effective resistance of the substrate includes:
means for increasing the effective resistance of the substrate.

* * * * *

UNITED STATES PATENT AND TRADEMARK OFFICE
CERTIFICATE OF CORRECTION

PATENT NO. : 7,020,857 B2
APPLICATION NO. : 10/063859
DATED : March 28, 2006
INVENTOR(S) : Steven H. Voldman and Raminderpal Singh It is certified that error appears in the above-identified patent and that said Letters Patent is hereby corrected as shown below:

Column 6:
Claim 4. Currently reads in the patent:

A method of improving latchup tolerance in an intgrated circuit having a substrate with an effective resistance, the method comprising the steps of:
identifying any parasitic pnpn structures; and automatically inserting a suppression circuit that supresses noise and improves latchup tolerance into the parasitic pnpn structure, the suppression circuit including a ring structure located within the pnpn structure.

Claim 4 Should read

A method of improving latchup tolerance in an intgrated circuit having a substrate with an effective resistance, the method comprising the steps of:
identifying any parasitic pnpn structures; and automatically inserting a suppression circuit that supresses noise and improves latchup tolerance into the parasitic pnpn structure, the suppression circuit including a p+ ring structure located within the pnpn structure.

Signed and Sealed this

Sixth Day of March, 2007

JON W. DUDAS
*Director of the United States Patent and Trademark Office*